(12) United States Patent
Okuda (10) Patent No.: US 10,128,162 B2
(45) Date of Patent: Nov. 13, 2018

(54) METHOD OF MANUFACTURING SEMICONDUCTOR DEVICE

(71) Applicant: TOYOTA JIDOSHA KABUSHIKI KAISHA, Toyota-shi, Aichi-ken (JP)

(72) Inventor: Masaru Okuda, Hashima (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/696,606

(22) Filed: Sep. 6, 2017

(65) Prior Publication Data

US 2018/0122717 A1 May 3, 2018

(30) Foreign Application Priority Data

Nov. 1, 2016 (JP) .................. 2016-214634

(51) Int. Cl.
| | | |
|---|---|---|
| *H01L 23/31* | (2006.01) | |
| *H01L 21/02* | (2006.01) | |
| *H01L 21/3065* | (2006.01) | |
| *H01L 21/311* | (2006.01) | |
| *H01L 21/3205* | (2006.01) | |

(52) U.S. Cl.
CPC .... *H01L 23/3157* (2013.01); *H01L 21/02164* (2013.01); *H01L 21/02282* (2013.01); *H01L 21/3065* (2013.01); *H01L 21/31105* (2013.01); *H01L 21/32051* (2013.01)

(58) Field of Classification Search
CPC .......... H01L 23/3157; H01L 21/02164; H01L 21/02282; H01L 21/3065; H01L 21/31105; H01L 21/32051
See application file for complete search history.

(56) References Cited

U.S. PATENT DOCUMENTS

| | | | |
|---|---|---|---|
| 2006/0273319 A1* | 12/2006 | Dairiki | ............... H01L 27/1214 257/66 |
| 2007/0284038 A1 | 12/2007 | Yamamoto et al. | |
| 2010/0110320 A1* | 5/2010 | Kitakado | .......... G02F 1/136286 349/39 |

FOREIGN PATENT DOCUMENTS

| | | |
|---|---|---|
| JP | 2007-311735 A | 11/2007 |
| JP | 2010-062415 A | 3/2010 |

* cited by examiner

*Primary Examiner* — Fei Fei Yeung Lopez
(74) *Attorney, Agent, or Firm* — Oliff PLC (57) ABSTRACT

A method of manufacturing a semiconductor device, the method may include: forming a SOG film on a wafer, the wafer including a semiconductor substrate and a polyimide film exposed on a surface of the wafer, and the SOG film being formed so as to cover the polyimide film; applying a protection tape on a surface of the SOG film; processing the wafer on which the protection tape is applied; and peeling the protection tape from the wafer.

2 Claims, 8 Drawing Sheets

METHOD OF MANUFACTURING SEMICONDUCTOR DEVICE

TECHNICAL FIELD

A technique disclosed herein relates to a method of manufacturing a semiconductor device.

BACKGROUND

Japanese Patent Application Publication No. 2007-311735 discloses a technique for a manufacturing process of a semiconductor device, in which a protection tape is applied to a surface of a wafer, the wafer is processed, and thereafter the protection tape is peeled from the wafer. When the wafer is processed, the protection tape suppresses a scratch and the like from occurring on the surface of the wafer.

SUMMARY

A wafer exists which includes a semiconductor substrate and a polyimide film exposed on a surface of the wafer. In this wafer, there may be a case where a protection tape is applied so as to cover the polyimide film. The protection tape adheres to the polyimide film with high adhesion strength. Especially, in a manufacturing process of a semiconductor device, surface roughness may be generated on the polyimide film. The protection tape adheres with even greater adhesion strength to the polyimide film having the surface roughness. Due to this, in a case where the protection tape is applied to cover the polyimide film, a problem may occur that an adhesive agent of the protection tape remains on the surface of the polyimide film when the protection tape is peeled off after the wafer has been processed.

A method of manufacturing a semiconductor device disclosed herein may comprise: forming a SOG film on a wafer which comprises a semiconductor substrate and a polyimide film exposed on a surface of the wafer, and the SOG film being formed so as to cover the polyimide film; applying a protection tape on a surface of the SOG film; processing the wafer on which the protection tape is applied; and peeling the protection tape from the wafer.

It should be noted that the above-mentioned "SOG film" is a Spin-On-Glass film and means a silicon oxide film formed by Spin-On-Glass method. Further, the above-mentioned "processing" means any of various processes performed to a wafer and includes, for example, grinding a wafer, etching a wafer, ion implantation to a wafer, forming an electrode on a wafer surface, forming an insulating layer on a wafer surface, or any combination thereof.

In this manufacturing method, the SOG film is formed so as to cover the polyimide film, and the protection film is applied to the SOG film. Since the SOG film is thin, the application of the protection tape to the surface of the SOG film can appropriately protect the surface of the wafer. Due to this, in the subsequent step of processing the wafer, a scratch and the like are suppressed from occurring on the surface of the wafer. After the wafer has been processed, the protection tape is peeled from the wafer. As described above, the polyimide film is covered by the SOG film, and the protection tape adheres to the surface of the SOG film. The protection tape can be easily peeled off from the SOG film. Therefore, an adhesive agent of the protection tape is suppressed from remaining on the surface of the SOG film. Due to this, trouble caused by residual adhesive agent can be suppressed from occurring in the manufacturing process of the semiconductor device.

DETAILED DESCRIPTION

Figure 1:
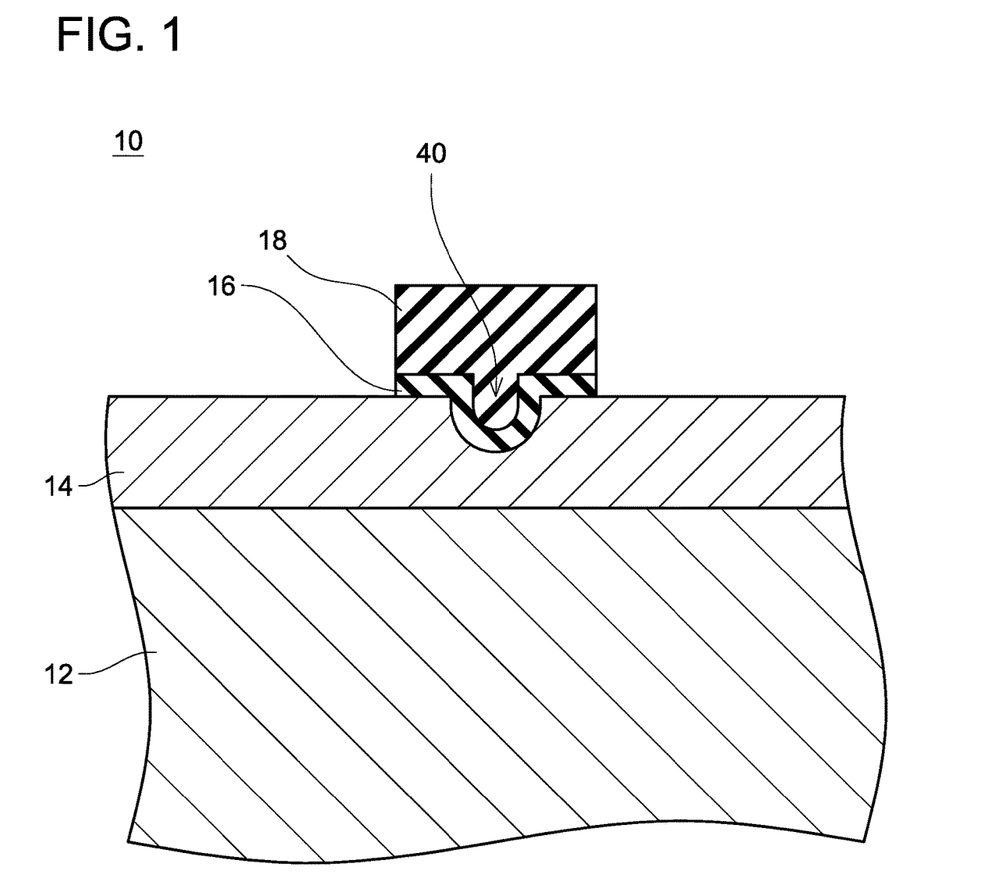
FIG. 1 is a cross sectional view of a semiconductor wafer.

A method of manufacturing a semiconductor device of an embodiment will be described. Firstly, a wafer 10 shown in FIG. 1 is prepared. The wafer 10 comprises a semiconductor substrate 12, an Al electrode 14, a protection film 16, and a polyimide film 18. The semiconductor substrate 12 is constituted of silicon. Although not shown, a part of an IGBT (Insulated Gate Bipolar Transistor) structure and a part of a pn diode structure are provided inside the semiconductor substrate 12. The Al electrode 14 is provided on a surface of the semiconductor substrate 12. The Al electrode 14 is constituted of aluminum. A recess 40 is provided in a surface of the Al electrode 14. The protection film 16 covers the recess 40 and the surface of the Al electrode 14 surrounding the recess 40. The polyimide film 18 covers a surface of the protection film 16. The polyimide film 18 is exposed on a surface of the wafer 10. In a portion of the surface of the wafer 10 on which the polyimide film 18 is not provided, the Al electrode 14 is exposed at the surface of the wafer 10.

Figure 2:
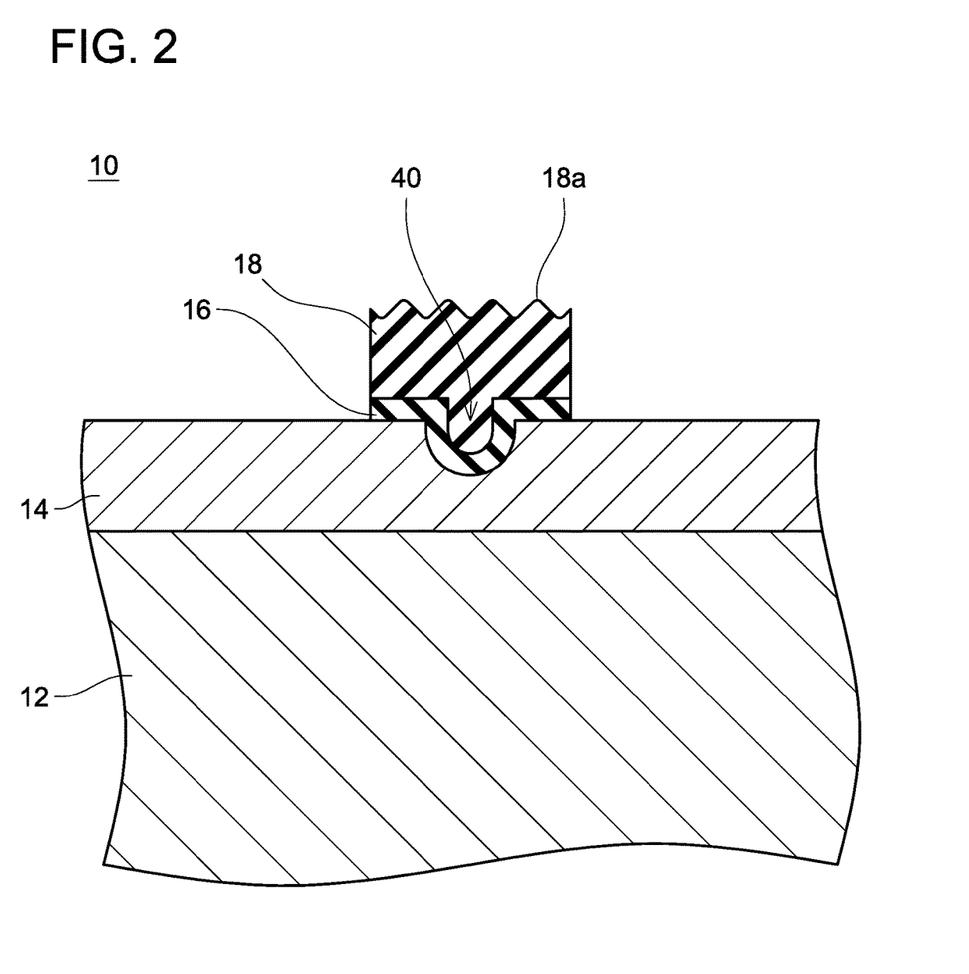
FIG. 2 is a cross sectional view of the semiconductor wafer after plasma processing.

Firstly, the surface of the wafer 10 is plasma-processed. More specifically, plasma is generated from etching gas containing fluorine ($SF_4$ in the present embodiment), and the Al electrode 14 is exposed to the generated plasma. Due to this, the fluorine bonds with aluminum at the surface of the Al electrode 14 (so-called fluorine termination process). In the process where the Al electrode 14 is exposed to the plasma, the polyimide film 18 is exposed to the plasma as well. When the polyimide film 18 is exposed to the plasma, a surface 18a of the polyimide film 18 becomes rough (surface roughness is generated thereon) as shown in FIG. 2.

Figure 3:
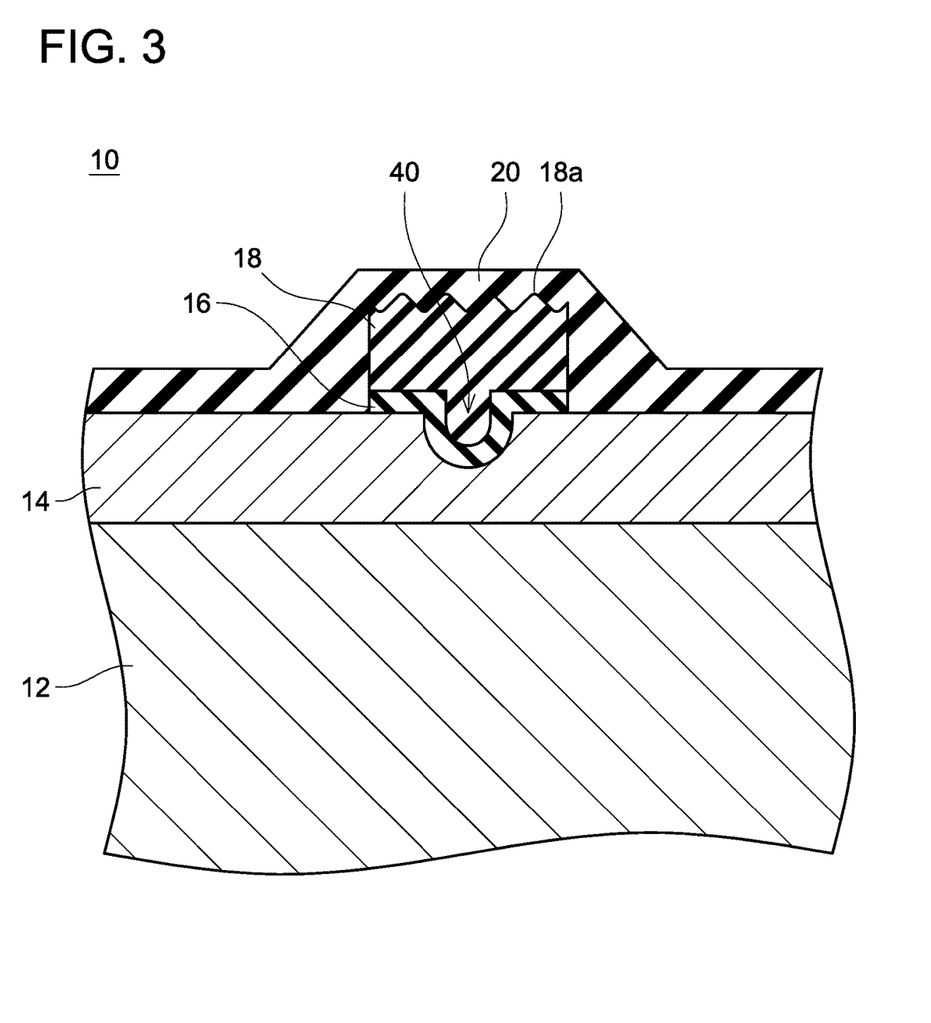
FIG. 3 is a cross sectional view of the semiconductor wafer after formation of a SOG film.

Next, as shown in FIG. 3, a silicon oxide film (i.e., SOG film) 20 is formed on the surface of the wafer 10 by SOG method. More specifically, a solvent containing silicon oxide is applied to a center portion of the surface of the wafer 10 (the surface on which the polyimide film 18 is exposed), while the wafer 10 is rotated at high speed. The solvent is thereby spread over an entirety of the surface of the wafer 10 by centrifugal force. Thereafter, the solvent is dried, which completes the formation of the SOG film 20 over the entirety of the surface of the wafer 10. The SOG film 20 covers the surface 18a of the polyimide film 18 and the surface of the Al electrode 14. The SOG film 20 has photosensitivity. That is, the SOG film 20 alters in its property when exposed to light having a specific wavelength (e.g., g-line, h-line, i-line, etc.). The SOG film 20 has heat resistance against approximately 400 degrees Celsius.

Figure 4:
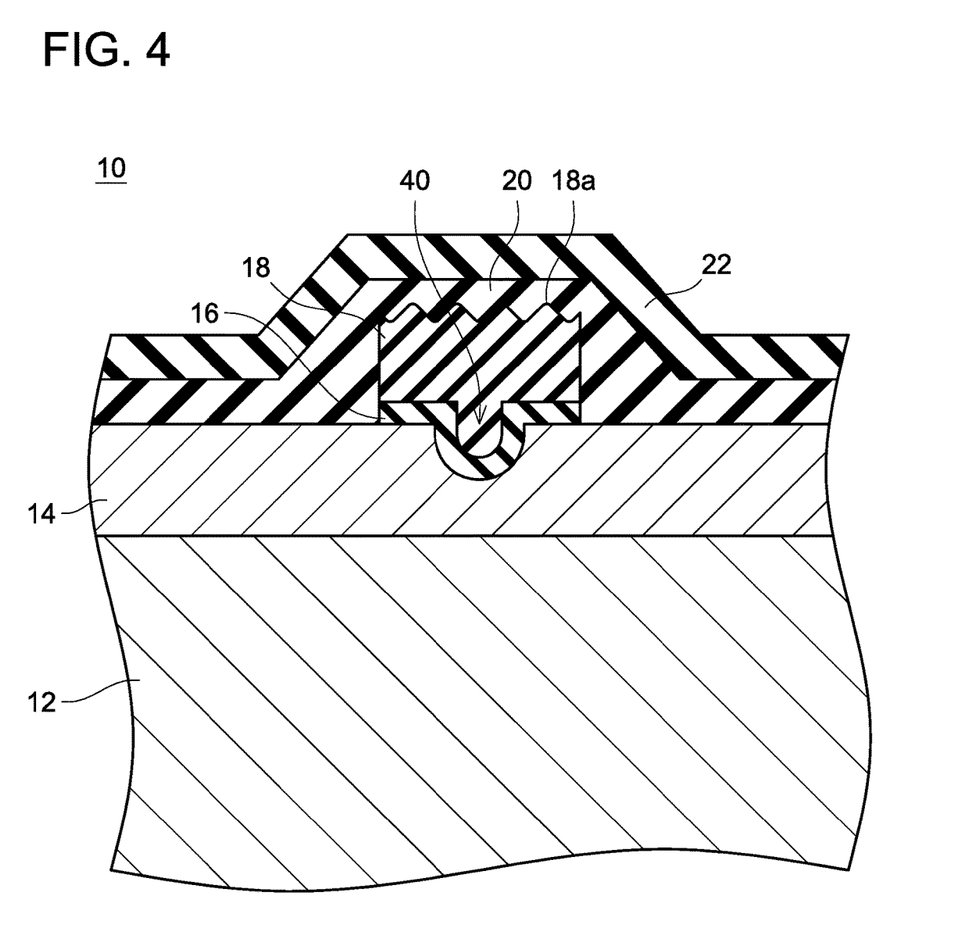
FIG. 4 is a cross sectional view of the semiconductor wafer after application of a protection tape.

Next, as shown in FIG. 4, a protection tape 22 is applied to a surface of the SOG film 20. The protection tape 22 includes an adhesive layer on its lower side. The protection tape 22 is fixed to the SOG film 20 by the adhesive layer adhering to the SOG film 20. Since the SOG film 20 is present between the polyimide film 18 and the protection tape 22, the protection tape 22 is not in contact with the polyimide film 18.

Next, a rear surface (surface opposite to the surface on which the polyimide film 18 and the like are provided, and not shown) of the semiconductor substrate 12 is etched to make the semiconductor substrate 12 thinner. Further, p-type impurities are implanted to the rear surface of the semiconductor substrate 12 to form a collector region of the IGBT. Further, n-type impurities are implanted to the rear surface of the semiconductor substrate 12 to form a cathode region of the pn diode. During these processes to the rear surface of the semiconductor substrate 12, the surface of the wafer 10 to which the protection tape 22 adheres is protected by the protection tape 22. Due to this, a scratch and the like are suppressed from occurring on the surface of the wafer 10.

Figure 5:
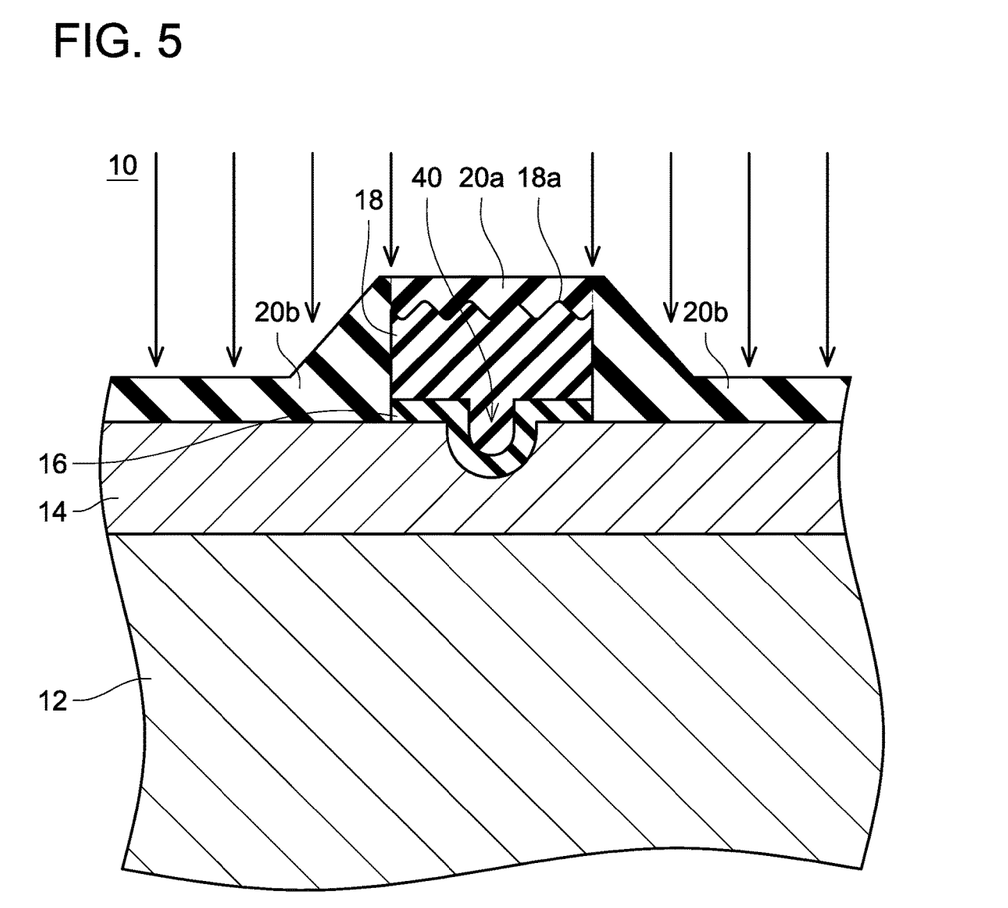
FIG. 5 is a cross sectional view of the semiconductor wafer after a photoprocess.

Next, as shown in FIG. 5, the protection tape 22 is peeled from the wafer 10. At this occasion, the protection tape 22 can be favorably peeled from the SOG film 20, since adhesion strength of the protection tape 22 relative to the SOG film 20 is not very high. Due to this, an adhesive agent of the protection tape 22 hardly remains on the surface of the SOG film 20. Since the adhesive agent of the protection tape 22 hardly remains on the surface of the SOG film 20, trouble is hardly caused by residual adhesive agent in the subsequent processes. Therefore, according to this manufacturing method, semiconductor devices can be manufactured with a high yield rate.

Next, as shown in FIG. 5, light is radiated to the SOG film 20 so that the SOG film 20 on the polyimide film 18 is not exposed to the light but the other portion of the SOG film 20 is exposed to the light. Here, light having a wavelength by which a property of the SOG film 20 is altered (e.g., light including g-line, h-line, i-line, and the like) is radiated. Due to this, the portion of the SOG film 20 exposed to the light is altered in its property. Hereinbelow, the SOG film 20 exposed to the light will be termed a SOGO film 20b, and the SOG film 20 not exposed to the light (the SOG film 20 on the polyimide film 18) will be termed a SOG film 20a.

Figure 6:
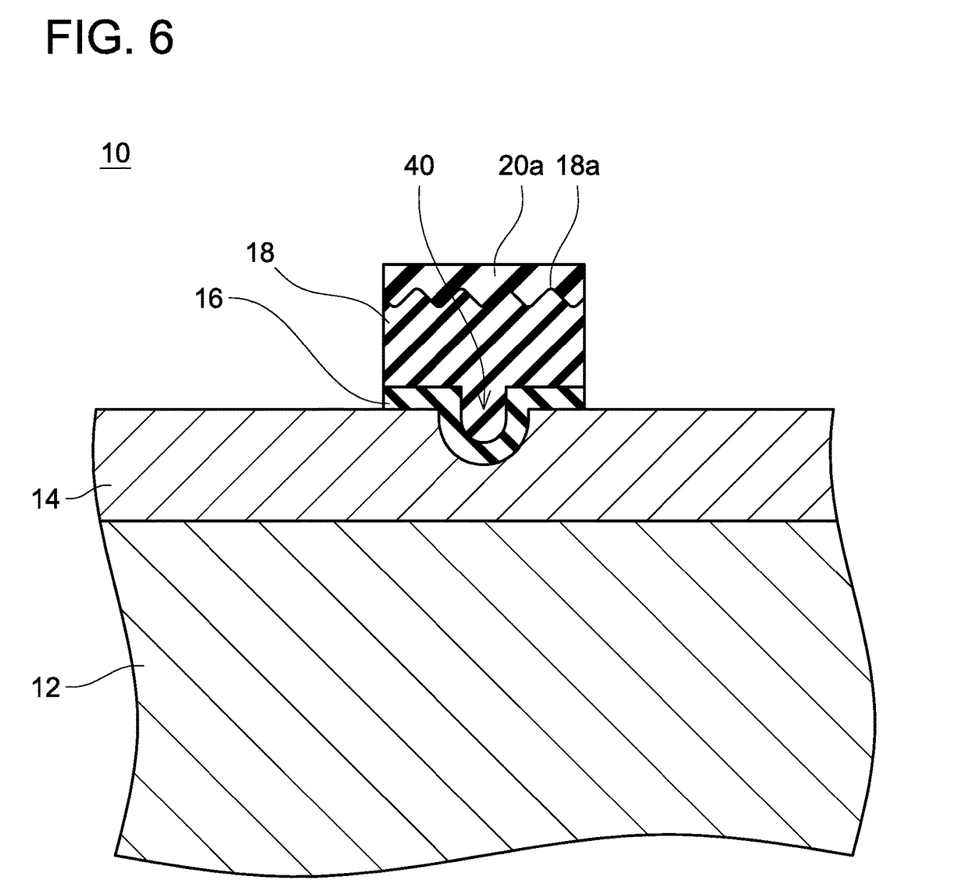
FIG. 6 is a cross sectional view of the semiconductor wafer after removal of the SOG film which was exposed to light.

Next, as shown in FIG. 6, the SOG film 20b is removed by developing liquid such as TMAH (Tetramethylammonium hydroxide). The SOG film 20a does not react with TMAH, and thus is not removed. Accordingly, as shown in FIG. 6, the SOG film 20a remains on the polyimide film 18.

Figure 7:
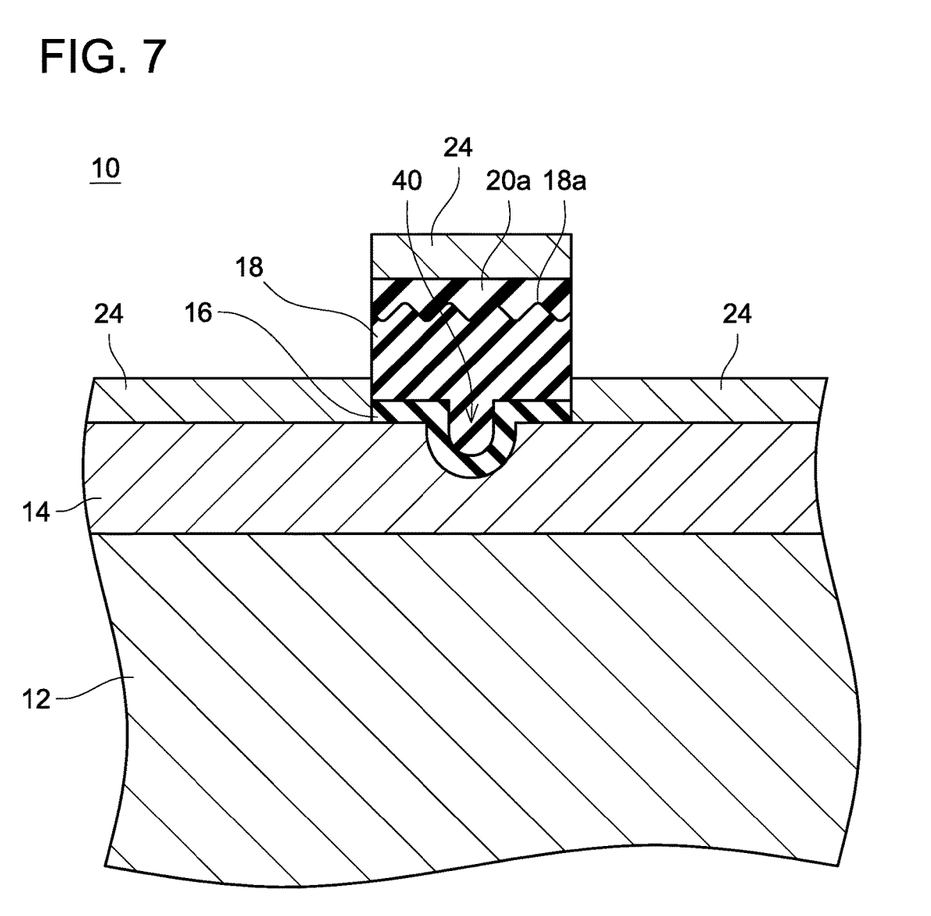
FIG. 7 is a cross sectional view of the semiconductor wafer after formation of a metal film.

Next, as shown in FIG. 7, a metal film 24 is formed on the surface of the wafer 10 by sputtering or the like. Since the SOG film 20a and the Al electrode 14 are exposed at the surface of the wafer 10, the metal film 24 is formed on a surface of the SOG film 20a and the surface of the Al electrode 14. In the present embodiment, the metal film 24 is constituted of nickel. Since the Al electrode 14 was plasma-processed beforehand, the metal film 24 firmly connects to the Al electrode 14. Due to this, the metal film 24 is difficult to peel from the Al electrode 14.

Figure 8:
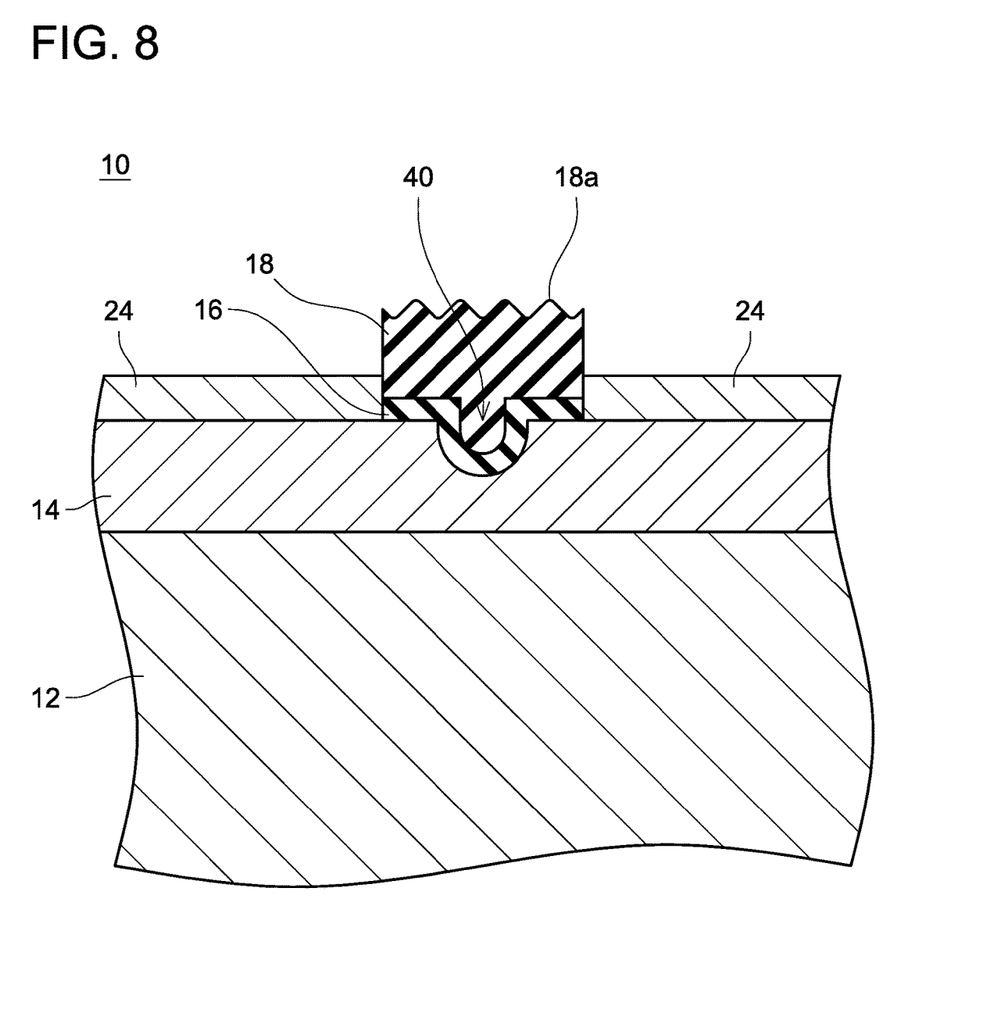
FIG. 8 is a cross sectional view of the semiconductor wafer after removal of the SOG film which was not exposed to light.

Next, as shown in FIG. 8, the SOG film 20a is removed by stripping liquid containing NMP (n-methyl-2-pyrrolidone) and the like as its main components. At this occasion, the metal film 24 disposed on the surface of the SOG film 20a is removed as well. Therefore, the polyimide film 18 is exposed at the surface of the wafer 10. According to this method, the metal film 24 can be patterned so that the metal film 24 remains on a portion where the metal film 24 contacts the Al electrode 14 but the metal film 24 does not remain on the polyimide film 18. In this method, the metal film 24 is patterned by photolithography using the SOG film 20, and thus the metal film 24 can be patterned with high accuracy.

It should be noted that the metal film 24 can be formed via a metal mask fixed on the surface of the wafer 10 so as to cover the surface of the polyimide film 18. Similarly to FIG. 8, the metal film 24 can be formed selectively on an exposed portion of the Al electrode 14 by arranging the metal mask so as to locate its opening above the exposed portion of the Al electrode 14. However, since the metal mask is fixed to the surface of the wafer 10 by magnetic force, the metal mask may separate from the surface at its portion where the magnetic force is insufficient. That is, a gap may be generated between the metal mask and the wafer 10. In this case, the metal film 24 may be formed in the gap on the surface of the polyimide film 18 which is located under the metal mask, and the metal film 24 may not be patterned accurately.

Contrary to this, according to the present embodiment (i.e., photolithography using the SOG film 20a), the aforementioned separation does not occur, and thus the metal film 24 can be patterned more accurately. Further, according to the present embodiment, the metal mask is unnecessary, and thus the semiconductor devices can be manufactured with lower cost.

Thereafter, necessary electrode(s), insulating layer(s), and the like are formed, which completes the semiconductor device.

As described above, in the manufacturing method of the present embodiment, since the protection tape 22 is applied to the SOG film 20, the adhesive agent hardly remains on the surface of the SOG film 20a when the protection tape 22 is peeled. Therefore, the trouble caused by residual adhesive agent can be suppressed. Further, if the adhesive agent remains on the surface of the SOG film 20a, the residual adhesive agent is also removed when the SOG film 20 is removed. Therefore, even in this case, the trouble caused by residual adhesive agent can be suppressed. Thus, according to the manufacturing method of the present embodiment, the semiconductor devices can be manufactured with a high yield rate.

Further, in the manufacturing method of the present embodiment, the SOG film 20 has photosensitivity, and the SOG film 20 after the protection tape 22 has been peeled off is used as a mask to pattern the metal film 24. Since the SOG film 20 has photosensitivity, the photolithography can be used. Therefore, the metal film 24 can be patterned with high accuracy. Further, since the SOG film 20 for suppressing the residual adhesive agent can be used as the mask as well, process(es) and material(s) necessary to form a mask for patterning the metal film 24 can be eliminated. Therefore, according to the manufacturing method of the present embodiment, the semiconductor devices can be manufactured with low cost.

Some of the features characteristic to technical elements disclosed herein will be listed below. It should be noted that the respective technical elements are independent of one another, and are useful solely or in combinations.

In an exemplary configuration disclosed herein, the SOG film may comprise photosensitivity. In this case, the method may further comprise exposing the SOG film to light so as to form an opening in the SOG film after the protection tape is peeled; and forming a metal film in the opening.

According to this configuration, the SOG film including the opening can be used as a mask when the metal film is formed. In this method, the metal film can be formed with high accuracy using the photolithography.

An exemplary manufacturing method disclosed herein may further comprise plasma-processing the surface of the wafer on which the polyimide film is exposed before the formation of the SOG film.

It should be noted that the plasma-processing means exposing the surface of the wafer to plasmas.

In this configuration, surface roughness is generated on the polyimide film by the plasma-processing. If the protection tape is applied to the surface of the polyimide film in this case, much adhesive agent remains on the surface of the polyimide film when the protection tape is peeled. Contrary to this, using the SOG film can prevent the adhesive agent from remaining. In this case, the effect of the SOG film on suppression of the residual adhesive agent is more effective.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A method of manufacturing a semiconductor device, the method comprising:

forming a SOG film on a wafer, the wafer comprising a semiconductor substrate and a polyimide film exposed on a surface of the wafer, and the SOG film being formed so as to cover the polyimide film;

applying a protection tape on a surface of the SOG film;

processing the wafer on which the protection tape is applied;

peeling the protection tape from the wafer;

exposing the SOG film to light so as to form an opening in the SOG film after the protection tape is peeled; and forming a metal film in the opening, wherein the SOG film comprises photosensitivity.

2. The method of claim 1, further comprising:

plasma-processing the surface of the wafer on which the polyimide film is exposed before the formation of the SOG film.

\* \* \* \* \*